United States Patent [19]
Salisbury

[11] Patent Number: 5,303,074
[45] Date of Patent: Apr. 12, 1994

[54] EMBEDDED REPAIR LINES FOR THIN FILM ELECTRONIC DISPLAY OR IMAGER DEVICES

[75] Inventor: Roger S. Salisbury, Schenectady, N.Y.

[73] Assignee: General Electric Company, Schenectady, N.Y.

[21] Appl. No.: 47,740

[22] Filed: Apr. 15, 1993

Related U.S. Application Data

[63] Continuation-in-part of Ser. No. 692,843, Apr. 29, 1991, abandoned.

[51] Int. Cl.[5] .................. G02F 1/133; H01L 29/68; G09G 3/36
[52] U.S. Cl. ........................ 359/59; 359/87; 257/292
[58] Field of Search ................ 359/54, 57, 58, 59, 359/60, 87, 88; 345/87, 92, 93; 257/59, 72, 291, 292; 313/505, 583

[56] References Cited

U.S. PATENT DOCUMENTS

| | | | |
|---|---|---|---|
| 4,688,896 | 8/1987 | Castleberry | 350/333 |
| 4,752,118 | 6/1988 | Johnson | 359/87 |
| 4,804,953 | 2/1989 | Castleberry | 340/784 |
| 4,807,973 | 2/1989 | Kawasaki | 350/332 |
| 4,840,459 | 6/1989 | Strong | 350/333 |
| 4,990,460 | 2/1991 | Moriyama | 437/40 |
| 4,991,939 | 2/1991 | Momose et al. | 350/333 |
| 5,045,753 | 9/1991 | Katayama et al. | 313/494 |
| 5,062,690 | 11/1991 | Whetten | 359/59 |
| 5,066,106 | 11/1991 | Sakamoto et al. | 359/59 |
| 5,086,347 | 2/1992 | Ukai et al. | 359/87 |

FOREIGN PATENT DOCUMENTS

| | | |
|---|---|---|
| 0095776 | 12/1983 | European Pat. Off. |
| 0109832 | 5/1984 | European Pat. Off. |
| 0269123 | 6/1988 | European Pat. Off. |
| 0318224 | 5/1989 | European Pat. Off. |
| 0221325 | 9/1988 | Japan |
| 0186325 | 7/1990 | Japan |

*Primary Examiner*—William L. Sikes
*Assistant Examiner*—Tai V. Duong
*Attorney, Agent, or Firm*—Donald S. Ingraham; Marvin Snyder

[57] ABSTRACT

A thin film electronic display device having electrically conductive transmission lines disposed therein has embedded repair lines positioned to be electrically coupleable to the transmission lines internally to the display device so that an open circuit on a transmission line can be bypassed by a repair line electrically coupled to the defective transmission line. A method of repairing a defective transmission line in this electronic display device includes identifying the defective transmission line, electrically isolating the defective portion of the transmission line, and electrically connecting the transmission line to its associated repair line.

21 Claims, 4 Drawing Sheets

EMBEDDED REPAIR LINES FOR THIN FILM ELECTRONIC DISPLAY OR IMAGER DEVICES

RELATED APPLICATIONS

This application is a continuation-in-part of application Ser. No. 07/692,843, filed Apr. 29, 1991, now abandoned.

BACKGROUND OF THE INVENTION

This invention relates generally to thin film electronic display or imager devices and more particularly to repair lines contained in devices such as liquid crystal displays or solid state imagers having a matrix of electrically conductive transmission lines for controlling the active components of the device.

Transmission lines for transmitting electrical signals to and from active components in a display or imager device are formed as integral parts of the structure of liquid crystal displays (LCDs) and solid state imagers. Such lines are also sometimes referred to as address lines. For ease of discussion, "display device" is used herein to refer to active cells of all types, including both LCDs and photosensors such as are used in imagers. These transmission lines usually form a matrix, with lines running in one direction designated as scan lines and lines running in a substantially perpendicular direction designated as data lines. The combination of the electrical signals (e.g. the voltage) on a scan line and a data line control a switching device, such as a field effect transistor (FET). The FET in turn controls the application of voltages to an active cell (pixel). In an LCD, for example, pixels contain liquid crystals disposed between transparent electrodes; the voltage applied to the electrodes governs the orientation of the liquid crystals which in turn determines the amount of light transmitted through the cell. Alternatively, the active component may be a photosensor, such as a photodiode, which generates an electrical output in response to incident optical photons. Application of the appropriate control signals to selected FETs in the array of photosensors allows the charge accumulated on corresponding photosensors from incident light to be read and directed to the processing circuitry. The resultant signals on the scan and data lines may then be used to electronically reproduce an image of the light detected by the array of photosensors.

A defect on a scan or data line can adversely affect overall performance of the thin film display device. For example, an open circuit condition can disable active components connected to the line beyond the point where the open circuit exists. A short circuit between a data and a scan line can also lead to inaccurate signals being applied to all switching transistors connected to either of the shorted data or scan lines. In either case, multiple pixels in the device can be affected, thereby significantly diminishing its resolution. A device having defective transmission lines may have to be discarded, depending upon the degradation of the resolution of the display device resulting from the inoperative pixels resulting.

Given the expense of fabricating thin film electronic display devices, it is desirable to have devices that are repairable after they have been assembled. In one common approach, a thin film display device has several auxiliary conductive lines disposed across the transmission lines on the sides of the device, usually outside the active areas of the device. See, e.g., U.S. Pat. No. 4,688,896, assigned to the assignee of the present invention, and which is incorporated herein by reference. In the display device described in that patent and in similar prior art devices, bypassing an open circuit in a defective line requires that one auxiliary line be connected to the defective line at one side of the device and that a second auxiliary line be connected to the defective line on the other side of the device. The auxiliary lines are electrically connected by a jumper or the like, allowing the signal to be applied to the defective line on both sides of the open circuit condition. Such display devices typically can have only a few auxiliary lines compared with the number of data and scan lines in the device. For example, a six inch by six inch imager might commonly have 1,536 data lines and 1,536 scan lines, but only sixteen auxiliary repair lines on a side. Further, repair of one transmission line typically requires use of two auxiliary lines, one on either side of the defective transmission line, and the use of an external jumper to connect the two auxiliary lines together. Once an auxiliary line is used to repair a given line, however, it cannot be used for repair of any other transmission line. Additionally, such a structure cannot be used to repair a transmission line having two or more open circuits along its length.

A second approach to producing repairable liquid crystal display devices has incorporated redundant or backup switching transistors coupled to the active components in the device. For example, the pending U.S. patent application of N. R. Whetten, Ser. No. 07/373,433, filed Jun. 30, 1989, now U.S. Pat. No. 5,062,690 which is assigned to the assignee of the present invention and is incorporated herein by reference, discloses built-in redundant FETs connected by laser-fusible links to the liquid crystal cells in the display device. In such a device, a redundant FET can be connected to a liquid crystal cell if a defect develops which disables the primary FET. Such an approach further provides for use of individually fusible crossover bypass links to be welded together at each crossover point as needed. Other approaches have included use of a complete second set address lines and switching transistors which are electrically connected to opposing sides of the liquid crystal cell at the time of fabrication and thus are in continuous operation, regardless of whether a defect exists on a given address line. Such an arrangement of duplicate lines reduces the amount of space in the display available for the active display devices.

A structure providing a high yield of conductive address lines is disclosed in U.S. Pat. No. 4,804,953, assigned to the assignee of the present invention and incorporated herein by reference. As described in that patent, multilayer repair and/or scan lines can be fabricated having two layers of metal in contact along substantially their entire length. An insulating layer having a width narrower than that of the conducting lines is disposed between them; the upper conducting line overlaps the insulating layer to make contact with the lower conducting line along substantially 90% of its length. Such multilayer lines provide a level of redundancy in the event an open circuit develops in a segment of the upper or lower conducting lines. Such an arrangement, however, does not provide for selective use of the redundant lines as both are in service at all times during operation of the device, and further with such an arrangement it is not possible to isolate a portion of one line to correct a short circuit in the device.

As display devices become larger, with increased numbers of scan and data lines, and as higher resolution is required of the device as a whole, fewer inoperative pixels can be tolerated. Larger devices having multiple switching transistors and associated electrical connections for each liquid crystal cell also involve greater cost and complexity of fabrication. Additionally, in some uses, thin film electronic display devices must be fabricated having connections for drivers on only two sides of the device, i.e., each data and scan line is structured so that it can receive an electrical input signal on only one end. In such devices a conventional auxiliary line arrangement with jumper connections cannot be used to repair a defective transmission line, as the scan and data lines extend outside of the active area of the display on only one side of the device.

It is accordingly an object of this invention to provide a thin film electronic display device structure having repair lines useable in display devices adapted to be driven from only two sides of the array.

It is another object of the present invention to provide a thin film electronic display device structure that does not require redundant or back-up switching transistors to repair a defect in a transmission or address line in a device.

It is another object of the present invention to provide a thin film electronic device structure that readily provides for repair of the device after it has been fabricated.

It is a further object of this invention to provide a novel method for repairing defects in scan or data lines in a thin film display device containing separate repair lines for each structure of the scan and data lines in the device.

These and other objects of the invention, together with the features and advantages thereof, will become apparent from the following detailed specification when read together with the accompanying drawings in which like reference numerals refer to like elements.

SUMMARY OF THE INVENTION

In accordance with the present invention, a thin film electronic display device having electrically conductive transmission lines disposed therein has associated repair lines embedded within the device. A repair line for an associated transmission line is disposed in a layer above or below the associated transmission line. The repair line is further positioned with respect to the transmission line to extend along substantially the entire length of the associated transmission line to allow electrical coupling between the associated transmission line and repair lines at selected connection points. The layer of transmission lines is insulated from the layer of repair lines by a dielectric layer, with the selective electrical coupling between a transmission line and an associated repair line being made by the removal of dielectric material disposed between them and the welding of the lines together. Advantageous selected connection points for electrical coupling include the ends of the transmission line, thus allowing an electrical signal applied to one end of the transmission line to be carried by the repair line to the opposite end of the transmission line, thereby bypassing an electrical defect at any intermediate point on the transmission line. Embedded repair lines disposed in substantial vertical alignment with their associated transmission lines allow multiple connection points to be made along the transmission line, thereby allowing numerous electrical defects on a transmission line to be bypassed.

The thin film electronic device is disposed on a substrate having four borders. Each transmission line has a first and a second end portion disposed substantially adjacent to respective opposite borders (e.g., first and second borders, respectively) of the substrate. The width of the first and second end portions of each transmission line is larger than the width of the remaining portion of the transmission line. The first end portion of the transmission line is embedded within the device so that only the second end portion is adapted to be coupled to an external drive circuit. Each repair line associated with a transmission line terminates in the vicinity of the respective borders of the substrate in respective first and second weld pads substantially aligned with the first and second end portions of the associated transmission line. Each of the weld pads has a width that is greater than the width of the remaining portion of the repair line.

In devices containing a plurality of transmission lines arranged as scan and data lines, each transmission line can have an associated repair line. The repair lines are embedded within the device and positioned with respect to the associated transmission lines to allow a defective portion of a transmission line at a crossover point of scan and data lines to be electrically isolated by severing the transmission line, for example with a laser beam, without severing the associated repair lines associated with the scan and data lines crossing at the crossover point.

A method of repairing a thin film device according to the present invention includes the steps of identifying the transmission line having the defect; isolating the defective portion of the defective transmission line, for example by severing the defective line in one or more places with a laser; and electrically coupling a repair line and the transmission line together, for example by using a laser to vaporize the dielectric material between the repair and transmission line and to weld the two lines together.

DETAILED DESCRIPTION OF THE PRIOR ART

Figure 1:
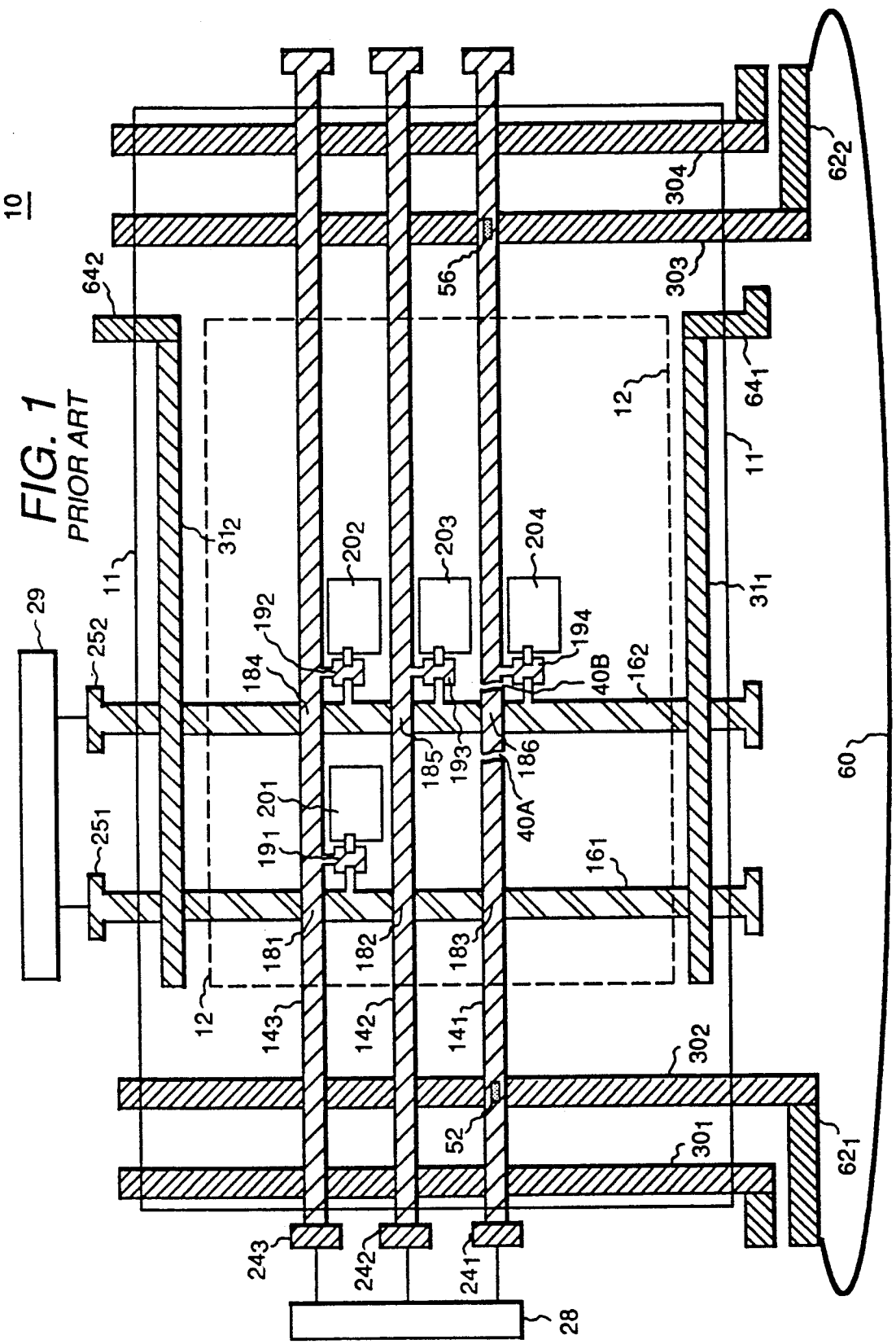
FIG. 1 is a schematic plan view of a portion of a thin film electronic display device of the prior art having scan and data transmission lines and auxiliary lines.

Referring to FIG. 1, which is illustrative of a common embodiment of the prior art, a thin film electronic display device 10 has an outer surface 11 within which a display area 12 and a plurality of transmission lines are disposed. The transmission lines are electrically conductive and transmit electrical signals to or from active components 20 in display area 12 of device 10.

The typical layout of transmission lines in a thin film display device creates a matrix of crossing lines. For example, scan lines $14_1, 14_2, \ldots 14_n$ are disposed to run across the device in a first direction and data lines $16_1, 16_2, \ldots 16_n$ are disposed in the device to be substantially orthogonal to the scan lines, thus forming a matrix of transmission lines in the device. For illustration purposes, not all scan and data lines in a typical device are shown. Crossover points $18_1, 18_2, \ldots 18_n$ exist where scan and data lines 14, 16 pass across one another. The scan and data lines are typically electrically insulated from one another by a dielectric layer (not shown) disposed between them. Scan and data lines 14, 16 are each coupled to a plurality of thin film switching devices $19_1, 19_2, \ldots 19_n$ such as FETs. Switching devices 19 are coupled to pixels $20_1, 20_2, \ldots 20_n$. For ease of illustration, not all switching devices or pixels are shown. Outside of display area 12, the scan lines have electrical connectors $24_1, 24_2, \ldots 24_n$ through which the scan lines are coupled to driving mechanism 28, and data lines 16 have electrical connectors $25_1, 25_2, \ldots 25_n$ through which they are coupled to driving mechanism 29. Driving mechanisms 28 and 29 are circuits that provide the electrical signals for the operation of device 10.

Auxiliary lines $30_1, 30_2, \ldots 30_n$ and $31_1, 31_2, \ldots 31_n$ are disposed across the transmission lines outside of active area 12. Auxiliary scan lines 30 are disposed across scan lines 14 and auxiliary data lines 31 are disposed across data lines 16. Auxiliary lines 30, 31 are electrically insulated from the transmission lines running across them by, for example, a layer of dielectric material (not shown).

Repair of a prior art thin film display device having, for example, a short circuit between a scan line such as scan line $14_1$ and data line $16_1$ at crossover $18_6$ would require severing scan line $14_1$ at points 40A and 40B. Severing, or cutting through the scan line to make it electrically nonconductive, isolates a segment of the line having the short circuit from the remainder of scan line $14_1$. Repair of scan line $14_1$ also requires the coupling of an auxiliary line, e.g. auxiliary line 30, to scan line $14_1$ at weld point 52; auxiliary line $30_3$, on the opposite side of the device, is similarly electrically coupled to scan line $14_1$ at weld point 56. Such coupling is typically made by welding the lines together with a laser. Jumper 60 extends between finger connection $62_1$ of auxiliary line $30_1$ and finger connection $62_2$ of auxiliary line $30_3$ to electrically connect the auxiliary lines to one another. This arrangement allows a signal applied from driver 28 to scan line $14_1$ to reach all parts of scan line $14_1$ except for the segment between severance points 40A and 40B. Similarly, if it were necessary to bypass an open circuit on data line $16_2$, for example, weld connections would be made to auxiliary line $31_1$ and $31_2$, with a jumper (not shown) connecting fingers $64_1$ and $64_2$.

DETAILED DESCRIPTION OF THE INVENTION

Figure 2A:
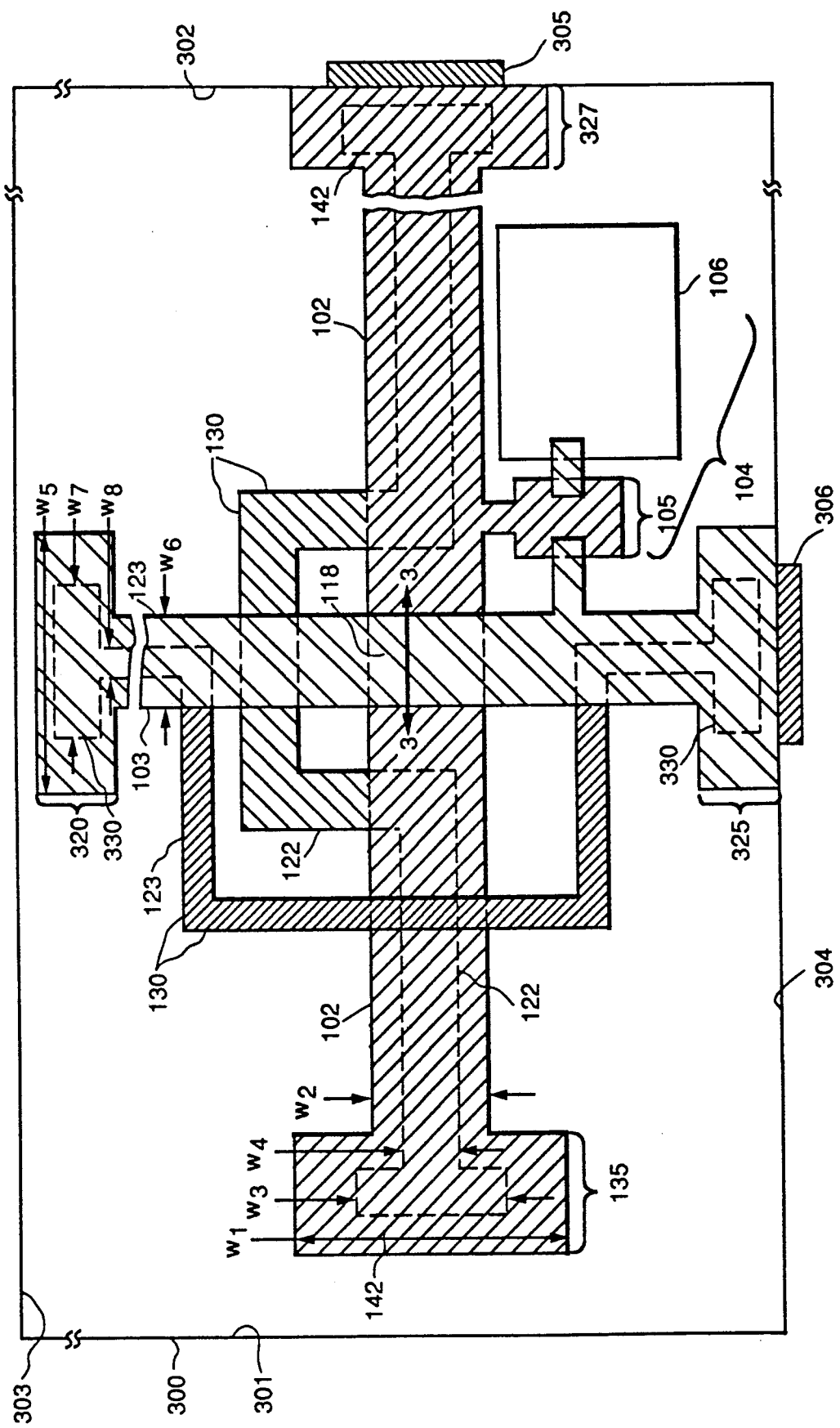
FIGS. 2A is a partially cut away plan view of a portion of a thin film electronic display device containing the repair lines of the present invention, with a representative scan line and a representative data line illustrated.

In the present invention, a thin film electronic device 100 as appears in FIG. 2A, is disposed on a substrate 300 which typically has a rectangular or square shape such that it has four borders 301–304 respectively. Substrate 300 typically comprises a nonconductive material such as glass or the like. Thin film electronic device 100 contains within it a plurality of electrically conductive transmission lines 102, 103. Such a thin film device may be of any type or kind through which transmission lines run; common examples would be solid state imagers or liquid crystal displays. The thin film display device will also typically have one or more active components 104 which may comprise a switching device 105, such as a field effect transistor (FET), and an active cell 106, such as a liquid crystal cell, a photodiode, or any other type of active imaging device. Electrical signals can be conducted along transmission line 102 to and from active components 104.

Transmission lines 102, 103 may comprise one or more electrically conductive materials and are embedded, i.e. integrally contained in one or more layers, within the structure of thin film display device 100. Thin film display device 100 will commonly have a plurality of transmission lines 102, 103 extending across the device to conduct electrical signals to or from active components 104 disposed in the device. A typical arrangement of transmission lines includes a plurality of scan and data lines. For illustration purposes in FIGS. 2A and 2B, a single scan line 102 is shown disposed across the device in a first direction and a single data line 103 is shown disposed across the device in a second direction substantially orthogonal to the scan line. Scan and data lines 102, 103 are disposed in different layers in the display device and are electrically insulated from one another, for example by a dielectric layer (not shown) disposed between them. Crossover points 118 exist where scan and data lines cross one another. Typically, each active component 104 is electrically coupled or connected to one data line and one scan line, via the switch action of FET 105.

In accordance with the present invention, one or more embedded repair lines 122, 123 are positioned in the display device to be electrically coupled, internally to the device, to an associated transmission line. As used herein, coupled "internally to the device" means that the position of any transmission line proximate to its associated repair line allows the two lines to be electrically coupled without the device needing to be disassembled to make the coupling, e.g., the coupling can be made by applying laser energy at a selected location along the transmission line to vaporize the intermediate dielectric layer and weld the transmission and repair line together. Further, no external connections, such as jumper 60 in FIG. 1, are required to complete an electrical connection to bypass a nonconducting segment of an associated transmission line. "Associated" lines refers to transmission and repair lines which are positioned with respect to one another in device 100 to be electrically coupled internally to the device; i.e., they run substantially one above the other, in substantially the same direction, but are normally separated from each other by an intermediate dielectric layer (not shown).

Each repair line is proximate to, or physically near, an associated transmission line and thus is positioned to be readily electrically coupleable to an associated transmission line. Electrically coupling the lines together enables electrical signals to be conducted onto the nondefective portion of the transmission line, making possible the use of the original active components that operated in conjunction with the now-defective transmission line, except to the extent that such components may be connected to the transmission line between points where the line was severed to electrically isolate the defect. For example, each repair line extends along substantially the entire length of its associated transmission line and is typically in substantial vertical alignment with the associated repair line, e.g., repair scan line 122 may be disposed beneath scan line 102. In particular, the repair line must lie in near vertical alignment with the associated transmission line, at least at selected connection points where the two lines are to be electrically coupled. Advantageously, selected connection points are at least located at or near the end of the associated transmission line, such as end portion 135 of scan line 102 as shown in FIG. 2A. This arrangement provides for maximum utility of the repair line by ensuring that the maximum number of active components can be supplied with electrical signals if a defective portion of the transmission line is severed and the repair line is connected to each end of the transmission line. Additional selected connection points can be made at any location along the transmission line where the associated repair line is in sufficient proximity to allow electrical coupling between the two associated lines. The repair line needs to be coupled to the defective transmission line in only as many locations as is necessary to repair the defects desired to be corrected in the transmission line.

For example, electrical coupling of scan line 102 to scan repair line 122 allows an electrical signal on scan line 102 to be electrically conducted to scan repair line 122. A laser can be advantageously used to accomplish the electrical coupling. By applying a laser beam, such as from a xenon pulse laser, to a selected connection point, e.g. 135, the dielectric layer between the transmission line and the repair line is vaporized and the conductive material of the two associated lines is welded together, thereby electrically connecting the two lines. Weld pad 142 at selected connection point 135 provides a repair line cross sectional area larger than that of other segments of the associated repair line for ease of welding at the ends of the lines. Other connection points may be selected along the length of the transmission line to couple the transmission line to its associated repair line at one or more locations, for example to bypass multiple open circuits in the defective transmission line.

Repair lines 122, 123 are also positioned with respect to crossover points 118 to allow scan lines 102 and data lines 103 to be severed adjacent to the crossover point without severing the associated repair lines. Severing of the scan or data line may be required to isolate a short circuit at the crossover point between the scan or data line. Severing or cutting of a transmission line is normally accomplished with a laser cutting through the defective line adjacent to the portion of the line which is the shorted. Repair line positioning with respect to crossover points may include a dog leg arrangement 130 in which repair lines 122, 123 do not run in substantial vertical alignment with the associated transmission line under the crossover point 118 but rather run at an angle to or parallel to it. Such an arrangement positions repair lines 122, 123 so that transmission lines 102, 103 may be severed adjacent to crossover point 118 without severing the associated repair lines. Additionally, the vertical positioning of the lines may allow a defective transmission line to be severed if the laser can be controlled to cut only to a depth at which the transmission line is disposed, but not beyond that depth to where the repair line is positioned.

Repair lines 122, 123 are electrically conductive and may have the same or similar construction as that of transmission lines 102, 103. Repair lines 122, 123 are electrically insulated from transmission lines 102, 103 typically by an intermediate layer (not shown) of a dielectric material such as silicon oxide or silicon nitride.

Further, in accordance with this invention thin film electronic device 100 is adapted to be be driven from only two sides of substrate 300. One end of each scan line 102 is adapted to be coupled to an external drive connection 305; similarly, one end of each data line 103 is adapted to be coupled to an external drive connection 306. In this arrangement, first end portion 135 of scan line 102 is embedded within the device, that is no portion of it is exposed such that no external electrical connections can be made to the device at this end portion. Scan line 102 terminates substantially adjacent to first border 301 of substrate 300 in first end portion 135, and terminates substantially adjacent to second border 302 of substrate 300 in a second end portion 137. Second end portion is disposed such that it is adapted to be coupled to external drive connection 305. The width "$W_1$" of the first and second end portions of transmission line 102 is larger than the width "$W_2$" of the remaining portion of the transmission line that extends across the substrate between the respective end portions. Similarly, the width "$W_3$" of weld pad 142 is greater than the width "$W_4$" of the remaining portions of repair line 122 disposed in association with scan line 102. The respective weld pad is substantially aligned with the associated end portion of the transmission line such that the greater width of both the transmission line and the repair line in the vicinity of the substrate borders provides a larger area of the respective lines (disposed substantially in the plane of the substrate) to facilitate repair of the device after fabrication when the numerous transmission lines and associated repair lines on the substrate are not readily visible.

Similarly, each data line 103 has a first end portion 320 that is embedded in the device and a second end portion 325 that is adapted to be coupled to external drive connection 306. Data line 103 terminates substantially adjacent to third border 303 of substrate 300 in first end portion 320 and terminates substantially adjacent to fourth border 304 of substrate 300 in a second end portion 325. The width "$W_5$" of the first and second end portions of scan line 103 is larger than the width "$W_6$" of the remaining portion of the transmission line that extends across the substrate between the respective end portions. Similarly, the width "$W_7$" of a weld pad 330 at a terminus of repair line 123 is greater than the width "$W_8$" of the remaining portions of repair line 123 disposed in association with data line 103. The respective weld pad is substantially aligned with the associated end portion of the transmission line such that the greater width of both the transmission line and the repair line in the vicinity of the substrate borders facilitates provides a larger area of the respective lines (disposed substantially in the plane of the substrate) to facilitate repair of the device after fabrication when the transmission lines and the repair lines are not readily visible.

Figure 2B:
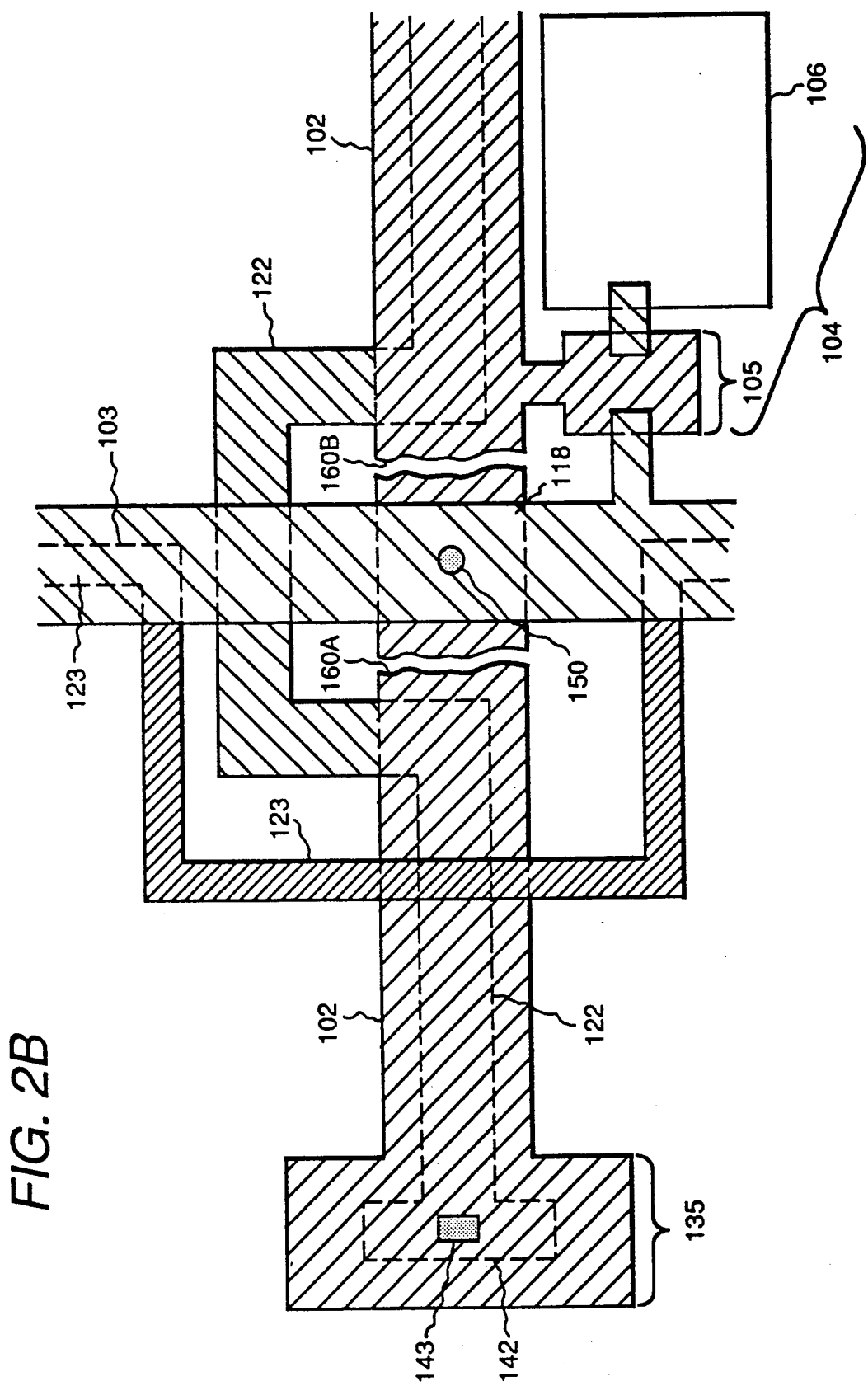
FIG. 2B is a partially cut away plan view of a portion of a thin film electronic display device of the present invention after isolation of a shorted scan line and data line.

Electrical defects on transmission lines which require repair include short circuits, open circuits, or other similar reasons, such as high resistance or crosstalk, that make it advisable to remove a segment of the transmission line from service. For example, as is illustrated in FIG. 2B, scan line 102 can be shorted to data line 103 at crossover point 118. In the repaired structure, scan line 102 has been severed at severance points 160A and 160B to electrically isolate the portion of the line with short circuit 150 from the remainder of scan line 102. Short circuits typically occur at or near crossover points, such as crossover point 118, when the dielectric layer separating the two transmission lines at the crossover point fails. Electrical isolation of the short is accomplished by severing one of the two shorted transmission lines adjacent to the crossover point. The severed transmission line can be repaired by coupling it to its associated repair line. For example, scan repair line 122 is electrically coupled to its associated scan line 102 at selected location 135 and at the opposite end of scan line 102 (not shown). The electrical coupling typically includes welded contact 143 between line 102 and repair line 122 at weld pad 142. The electrical coupling of scan repair line 122 to each end of scan line 102 bypasses the open circuit created by severance points 160A and 160B, thereby providing a path for electrical signals to be conducted to active components connected to scan line 102 on either side of the now isolated segment of the scan line containing shorted area 150.

As shown in FIG. 2(B), severance points 160A, 160B are preferably adjacent to crossover point 118 so as to not disable active component 104 coupled to scan line 102 and data line 103 in proximity to crossover point 118. Similarly, should an open circuit condition develop for any reason at any point on scan line 102, electrically coupling scan line 102 to associated repair line 122 will allow the open circuit to be bypassed. Likewise, an open circuit on data line 103 can be bypassed by coupling data repair line 123 to it at the selected connection points.

As is apparent in FIG. 2B, when a short circuit occurs between a scan and data line, it is typically not necessary that both the scan and the data lines be severed and attached to their respective repair lines to repair the device. Severing one of the two shorted transmission lines effectively isolates the short. Each repair line is completely self-contained; thus a device containing this invention may employ as many or as few repair lines as the fabricator of the device desires. For example, only one set of transmission lines, e.g. the scan or the data lines, but not both, might have associated repair lines. In such an embodiment, however, no repair line would be available to remedy an open circuit defect that might occur on the transmission lines not having associated repair lines. Thus, to provide maximum reliability and repairability, a display device made in accordance with this invention will preferably have associated repair lines for all transmission lines.

Figure 3:
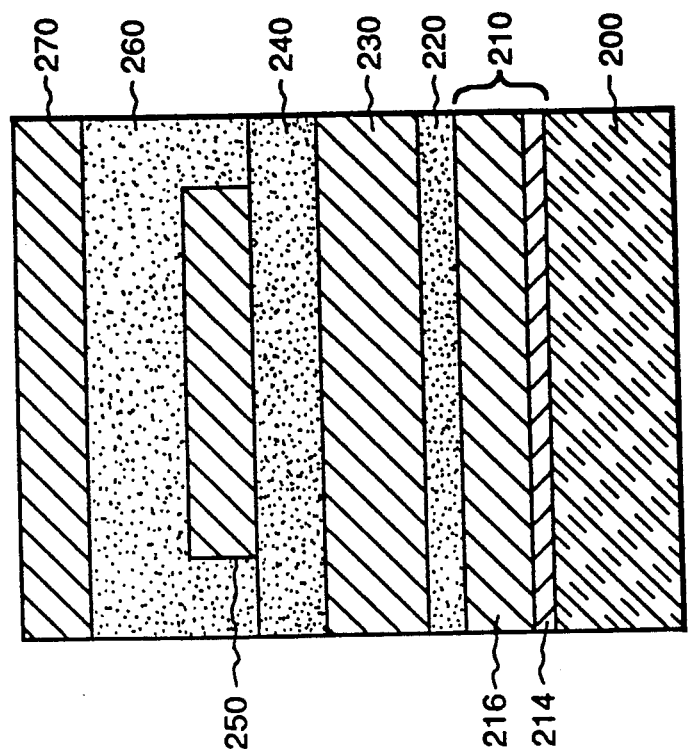
FIG. 3 is a cross sectional view of the scan and data lines and their associated repair lines, taken along lines 3–3 of FIG. 2A, and in accordance with one embodiment of the present invention.

Referring to FIG. 3, an embodiment of the display device as illustrated in FIG. 2A (section view taken along line 3—3 of FIG. 2A) containing the invention comprises substrate 200, of glass or the like, on which repair scan line 210 is disposed. Repair line 210 may comprise one or more conductive layers, and advantageously has a first conductive layer 214 of chromium and a second conductive layer 216 of molybdenum. The chromium adheres well to glass substrate 200 and provides a conductive base on which another layer having advantageous conductive characteristics, such as low bulk resistance, can be disposed. One or more of the materials comprising the conductive layers of repair line 210 is laser weldable, so that the repair line may readily be electrically coupled to an associated transmission line. Molybdenum can be advantageously used as the material for second conductive layer 216 because of its good conductive characteristics and its laser weldability. Dielectric layer 220, comprising silicon oxide or silicon nitride, is disposed on top of repair line 210. The materials comprising the dielectric layers in the device are removable, e.g. through being vaporized by a laser, to allow the electrical coupling of associated transmission and repair lines. Scan line 230 is disposed on top of dielectric layer 220. Scan line 230 may, but does not necessarily, comprise one or more conductive layers. A repair line may, but need not necessarily, have the same cross sectional area as its associated transmission line. As illustrated in FIGS. 2A and 2B, the repair lines may be narrower than their associated scan lines. Disposed above scan line 230 is dielectric layer 240 comprised of any material providing satisfactory electrical insulation between the respective lines stacked in the device. For example, a layer of silicon nitride or silicon oxide may be used. Insulation material used in the fabrication of active components may also be used to provide the insulative effect. Data repair line 250 is disposed above dielectric layer 240. and may, but does not necessarily, comprise one or more layers, and has the conductive and laser weldability characteristics described with respect to the scan lines. Dielectric layer 260 is disposed above and overlaps data repair line 250 and comprises similar insulative materials as discussed above with respect to layer 220. Data line 270 is disposed on top of dielectric layer 260 and has the conductive and laser weldability characteristics described with respect to the scan repair lines, and advantageously comprises molybdenum. Additional layers of material not pertinent to this invention may be disposed above data line 270.

The present invention also allows the use of a novel method of repairing a defective transmission line in a thin film electronic display device. When, as a result of poor display device performance, a defective condition is suspected, the defective transmission line is identified. For example, a voltage may be applied to one end of the scan line, and measurements for voltage are taken on the opposite end of the line to reveal whether an open circuit exists. Measurements taken on crossing transmission lines reveal whether a short circuit exists. Specifically, if a voltage is applied to a scan line, voltage measurements are taken on the data lines that cross the scan line. Once the defective portion of the transmission line having a short circuit is identified, it is electrically isolated by severing the transmission line on either side of the short. Severing can be accomplished by physically separating or cutting the line to make it non-conductive, as for example with a laser. In the case of an open circuit condition, no additional steps are needed to electrically isolate the defective portion of the transmission line. Finally, the repair line is electrically coupled to the defective transmission line at selected connection points internally to the device. A laser can be used to accomplish the electrical coupling; the laser vaporizes the intermediate dielectric layer and welds the repair line to its associated transmission line by causing the transmission line to melt at the spot where the dielectric layer is vaporized and flow to the repair line through the opening thus formed in the dielectric layer.

It will be readily understood by those skilled in the art that the present invention is not limited to the specific embodiments described and illustrated herein. Many variations, modifications and equivalent arrangements will now be apparent to those skilled in the art, or will be reasonably suggested by the foregoing specification and drawings, without departing from the substance or scope of the invention. Accordingly, it is intended that the invention be limited only by the spirit and scope of the appended claims.

WHAT IS CLAIMED IS:

1. A thin film electronic display device comprising:
   a substrate;
   a plurality of electrically conductive first transmission lines disposed on said substrate in a first layer, each of said transmission lines having first and second end portions disposed substantially adjacent to first and second borders respectively of said substrate, each of said end portions further having a width that is greater than the width of remaining portions of said transmission line, said first end portion being embedded within said device so that only said second end portion is adapted to be coupled to an external drive circuit;
   a plurality of electrically conductive first repair lines disposed in said device in a second layer, each of said repair lines being embedded within said device and associated with a respective one of said first transmission lines and extending along substantially the entire length of said respective associated first transmission line, each of said first repair lines being proximate to said respective associated first transmission line at selected connection points and electrically coupleable, within said device, to said respective associated first transmission line at selected connection points, each of said repair lines further terminating at said first and second border of said substrate in respective first and second weld pads substantially aligned respectively with the first and second end portions of the associated first transmission line, each of said first and second weld pads having a width that is greater than the width of remaining portions of said repair line; and
   a dielectric layer disposed between said first repair lines and said first transmission lines, said dielectric layer being removable at said selected connection points to provide for electrical coupling between each of said repair lines and said respective associated first transmission line so that an electrical defect on one of said first transmission lines between a pair of said selected connection points is bypassed by one of said repair lines when said transmission and repair lines are connected together at said pair of said selected connection points.

2. The device of Claim 1 wherein said selected connection points are at said first and second end portions of said associated first transmission line.

3. The device of Claim 2 wherein said repair lines are substantially vertically aligned with said respective associated transmission lines.

4. The device of Claim 1 further comprising a plurality of electrically conductive second transmission lines disposed on said display device in a third layer, said second transmission lines running substantially between a third and fourth border of said substrate and terminating in first and second end portions proximate to said third and fourth borders, each of said first and second end portions having a width that is greater than the width of remaining portions of said second transmission line, said first end portion being embedded within said device so that only said second end portion is adapted to be coupled to an external drive circuit, each of said second transmission lines being substantially orthogonal to, and electrically insulated from, said first transmission lines, said second transmission lines passing across said first transmission lines at crossover points.

5. The device of Claim 4 including a plurality of second repair lines being associated with a respective second transmission line, each of said second repair lines being embedded within said device and extending along substantially the entire length of said respective associated second transmission line, each of said second repair lines further terminating proximate to said third and fourth borders of said substrate in respective first and second weld pads substantially aligned with the first and second end portions of the associated second transmission line, each of said first and second weld pads having a width that is greater than the width of remaining portion of said second repair line; each of said second repair lines being proximate to said respective associated second transmission line at additional selected connection points and electrically coupleable, within said device, to said respective associated second transmission line.

6. The device of claim 5 wherein each of said first and second repair lines is positioned with respect to said crossover points to allow said first and said second transmission lines to be severed adjacent to said crossover points without severing said associated first and second repair lines.

7. The device of claim 4 wherein each of said first and second transmission lines and each of said first and second repair lines comprises a laser weldable material.

8. The device of claim 7 further comprising a substrate having said first repair lines disposed thereon.

9. The device of claim 8 wherein said first repair lines comprise a lower and an upper conductive layer of chromium and molybdenum respectively.

10. The device of claim 4 further comprising at least one active component electrically coupled to one of said first transmission lines and one of said second transmission lines.

11. The device of claim 10 wherein said active component comprises a liquid crystal cell.

12. The device of claim 10 wherein said active component comprises a photosensor.

13. An electronic display device comprising:
   a substrate;
   a plurality of electrically conductive scan lines extending in a first layer across said substrate in a first direction, each of said scan lines having first and second end portions substantially adjacent to respective first and second borders of said substrate, each of said first and second end portions having a width that is greater than the width of remaining portions of said scan line, said first end portion of each of said scan lines being embedded within said device so that only said second end portion of each of said scan lines is adapted to be coupled to an external drive circuit;
   a plurality of electrically conductive data lines extending in a second layer across said device in a second direction, said second direction being substantially perpendicular to said first direction so that said scan lines pass across said data lines at crossover points, each of said data lines having first and second end portions substantially adjacent to respective third and fourth borders of said substrate, each of said first and second end portions having a width that is greater than the width of the remaining portions of said data line, said first end portion of each of said data lines being embedded within said device so that only said second end portion of each of said data lines is adapted to be coupled to an external drive circuit;

a plurality of scan repair lines, each of said scan repair lines being associated with a respective one of said scan lines and embedded within said device and extending in a third layer along substantially the entire length of each of said respective associated scan lines, each of said scan repair lines being proximate to each of said respective associated scan lines to be electrically coupleable, internally to said device, at selected connection points each of said scan repair lines further terminating at said first and second border of said substrate in respective first and second weld pads substantially aligned with the first and second end portions of the respective associated scan line, each of said first and second weld pads having a width that is greater than the width of the remaining portion of said repair line;

a plurality of data repair lines, each of said data repair lines being associated with a respective one of said data lines and embedded within said device and extending in a fourth layer along substantially the entire length of each of said respective associated data lines, each of said data repair lines being proximate to each of said respective associated data lines to be electrically coupleable, internally to said device, at selected connection points each of said data repair lines further terminating at said third and fourth border of said substrate in respective first and second weld pads substantially aligned with the first and second end portions of the respective associated data line, each of said first and second weld pads having a width that is greater than the width of the remaining portion of said repair line;

a plurality of active components, each of said active components being electrically coupled to at least one of said scan lines and at least one of said data lines, each of said active components further being disposed on said substrate so as to not overlie any one of the respective data repair line and scan repair line weld pads; and a first dielectric layer disposed to insulate each of said scan lines from said associated scan repair lines and a second dielectric layer disposed to insulate each of said data lines from said associated data repair lines, said first and second dielectric layers being removable at said selected connection points to provide for electrical coupling between said associated scan lines and scan repair lines and between said associated data lines and data repair lines respectively, such that an electrical defect on any one of said scan lines or said data lines between said connection points can be bypassed by one of said associated repair lines when said lines are coupled together;

said display device further being adapted to be electrically driven by connections only to one end of each of said scan and data lines.

14. The device of claim 13 wherein each of said scan and data lines and each of said associated repair lines is laserweldable.

15. The device of claim 13 wherein each of said scan repair lines, respectively, is substantially vertically aligned with said respective associated scan line along substantially the entire length thereof and each of said data repair lines, respectively, is substantially vertically aligned with said respective associated data line along substantially the entire length thereof.

16. The device of claim 13 further comprising a substrate having said repair scan lines disposed thereon, wherein said repair scan lines comprising upper and lower conductive layers of chromium and molybdenum respectively.

17. The device of claim 13 wherein each of said scan and data repair lines is positioned with respect to said crossover points to allow the scan or data lines crossing at said points to be severed adjacent to said crossover points without severing said scan repair and said data repair lines.

18. The device of claim 13 wherein said active components comprise field effect transistors (FETs).

19. The device of claim 18 wherein said active components further comprise liquid crystal cells coupled to said FETs.

20. The device of claim 18 wherein said active components further comprise photodiodes coupled to said FETs.

21. The device of claim 13 wherein each of said first, second, third and fourth layers is separated from the other by at least one dielectric layer.

* * * * *